(12) United States Patent
Roberts et al.

(10) Patent No.: US 8,659,171 B2
(45) Date of Patent: Feb. 25, 2014

(54) PATCH ON INTERPOSER ASSEMBLY AND STRUCTURES FORMED THEREBY

(71) Applicants: Brent M. Roberts, Phoenix, AZ (US); Mihir K. Roy, Chandler, AZ (US); Sriram Srinivasan, Chandler, AZ (US)

(72) Inventors: Brent M. Roberts, Phoenix, AZ (US); Mihir K. Roy, Chandler, AZ (US); Sriram Srinivasan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/753,863

(22) Filed: Jan. 30, 2013

(65) Prior Publication Data

US 2013/0141859 A1 Jun. 6, 2013

Related U.S. Application Data

(62) Division of application No. 12/655,588, filed on Dec. 31, 2009, now Pat. No. 8,389,337.

(51) Int. Cl.
*H01L 23/52* (2006.01)

(52) U.S. Cl.
USPC .... 257/778; 257/691; 257/692; 257/E21.499; 257/E13.171

(58) Field of Classification Search
USPC ............... 257/691–692; 438/4.118, 121, 124, 438/127, 126, 110, 119, 125
See application file for complete search history.

(56) References Cited

U.S. PATENT DOCUMENTS

| 5,281,151 | A | 1/1994 | Arima et al. |
| 6,818,318 | B2 | 11/2004 | Konarski |
| 8,193,624 | B1 | 6/2012 | Sohn |
| 8,389,337 | B2 | 3/2013 | Roberts et al. |
| 2003/0038378 | A1 | 2/2003 | Jacobs |
| 2005/0281008 | A1 | 12/2005 | He et al. |
| 2006/0220175 | A1 | 10/2006 | Guzek et al. |
| 2007/0001277 | A1 | 1/2007 | Ichikawa |
| 2009/0113698 | A1 | 5/2009 | Love et al. |
| 2011/0171756 | A1 | 7/2011 | Andry et al. |

FOREIGN PATENT DOCUMENTS

| JP | 2004-327951 A | 11/2004 |
| JP | 2005-011908 A | 1/2005 |
| JP | 2006-086399 A | 3/2006 |
| JP | 2009-088464 A | 4/2009 |
| WO | 2007/052422 A1 | 5/2007 |
| WO | 2011/081844 A2 | 7/2011 |
| WO | 2011/081844 A3 | 10/2011 |

OTHER PUBLICATIONS

International Search Report and Written Opinion Received for PCT Patent Application No. PCT/US2010/059843, Mailed on Aug. 10, 2011, 9 pages.
International Preliminary Report on Patentability Received for PCT Patent Application No. PCT/US2010/059843, Mailed on Jul. 7, 2012, 7 pages.
Office Action received for Japanese Patent Application No. 2012-539093, mailed on Jul. 16, 2013, 7 pages of Office Action Including 3 pages of English Translation.

*Primary Examiner* — Dung A. Le
(74) *Attorney, Agent, or Firm* — Winkle, PLLC

(57) ABSTRACT

Methods of forming microelectronic structures are described. Embodiments of those methods include attaching a patch structure to an interposer by thermal compression bonding, forming an underfill around an array of interconnect structures disposed on a top surface of the interposer, curing the underfill, and then attaching a die to the patch structure.

15 Claims, 5 Drawing Sheets

PATCH ON INTERPOSER ASSEMBLY AND STRUCTURES FORMED THEREBY

RELATED APPLICATIONS

The present application is a Divisional of U.S. application Ser. No. 12/655,588 filed Dec. 31, 2009, entitled "PATCH ON INTERPOSER ASSEMBLY AND STRUCTURES FORMED THEREBY".

BACKGROUND OF THE INVENTION

Integrated circuits typically include various active and passive circuit elements which have been integrated into a piece of semiconductor material, often referred to as a die. The die may, in turn, be encapsulated into a package. Various package designs have been utilized, such as for example, the pin grid array (PGA), ball grid array (BGA) and land grid array (LGA) packages. The die package may then be attached to another substrate, such as a circuit board, in some cases.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
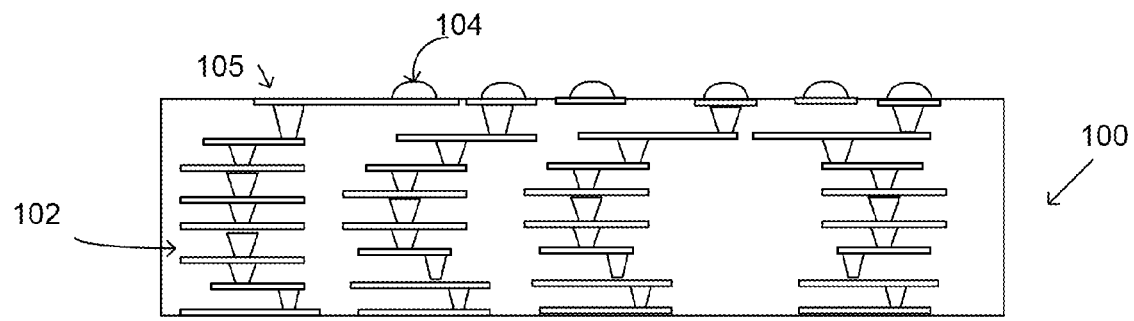
FIGS. 1a-1e represent methods of forming structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a package structure, are described. Those methods may include attaching a patch structure to an interposer by thermal compression bonding, forming an underfill around an array of interconnect structures disposed on a top surface of the interposer, curing the underfill, and then attaching a die to the patch structure. Methods of the various embodiments may enable patch on interposer substrate package technology.

FIGS. 1a-1e illustrate embodiments of methods of forming microelectronic structures, such as patch on interposer (PoINT) structures, for example. FIG. 1a illustrates an interposer 100. In one embodiment, the interposer 100 may comprise a laminated interposer design with stacked laser fabricated vias. The stacked vias 102 may act as vertical interconnect structures within the interposer 100, wherein the vertical interconnect structures may be stacked upon each other. The interposer 100 may further comprise interconnect structures 104 on a top surface 105 of the interposer 100. In an embodiment, the array of interconnect structures 104 may comprise mid level interconnect (MLI) solder balls, such as but not limited to MLI ball all grid array solder balls. In an embodiment, the interposer may comprise at least one of a motherboard and a small card, such as but not limited to a cell phone card.

Figure 1B:
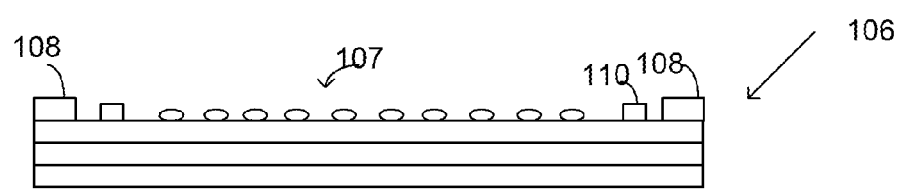

FIG. 1b depicts a patch structure 106. In an embodiment, the patch structure 106 may comprise a thin core (of about 400 microns in thickness, for example) patch structure 106. In embodiments, the patch structure 106 may support routing (RTG) and power delivery (PD) functions of a microelectronic device/system. In an embodiment, the patch structure 106 may comprise a stiffener, 108 and a die side capacitor (DSC) 110. The patch structure 106 may further comprise patch interconnect structures 107, which may comprise solder balls in some embodiments.

Figure 1C:
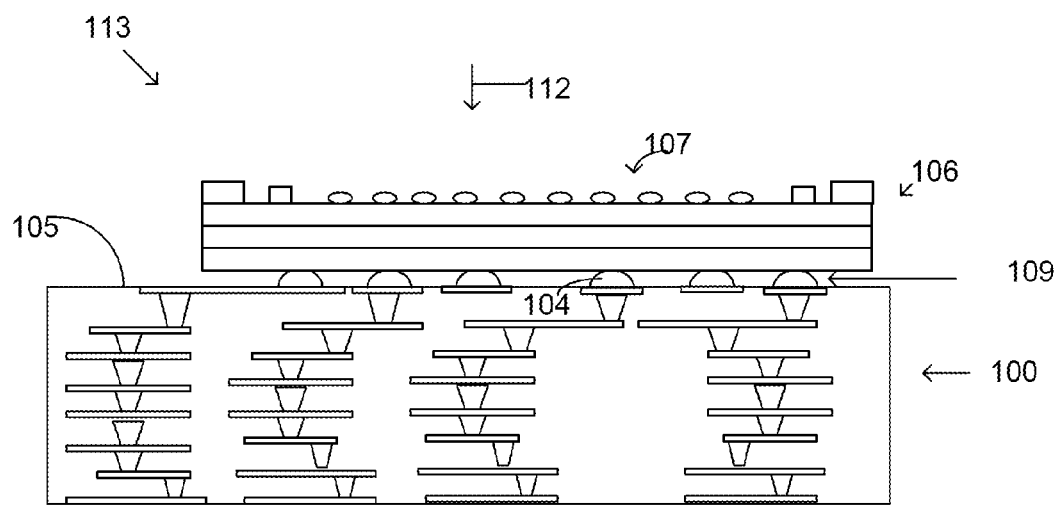

In an embodiment, the patch structure 106 may be attached to the interposer 100 through mid level interconnects (MLI) BGA connections 104 to form a patch on interposer structure 113 (FIG. 1c). The attachment of the patch structure 106 to the MLI 104 of the interposer 100 may be performed by a thermal compressive bonding (TCB) process 112. In some embodiments, the TCB process 112 may comprise at least one of a miniball (reduced diameter solder ball) or a surface mount technology (SMT) attachment process, such as by utilizing a LGA-like pad with solder paste on the interposer.

In an embodiment, the TCB process 112 may include localized application of heat, thus limiting the exposure of heat to the entire package and potentially limiting the warpage impact. In an embodiment, a solder joint 109 may attach/join the patch structure 106 to the interposer 100.

Figure 1D:
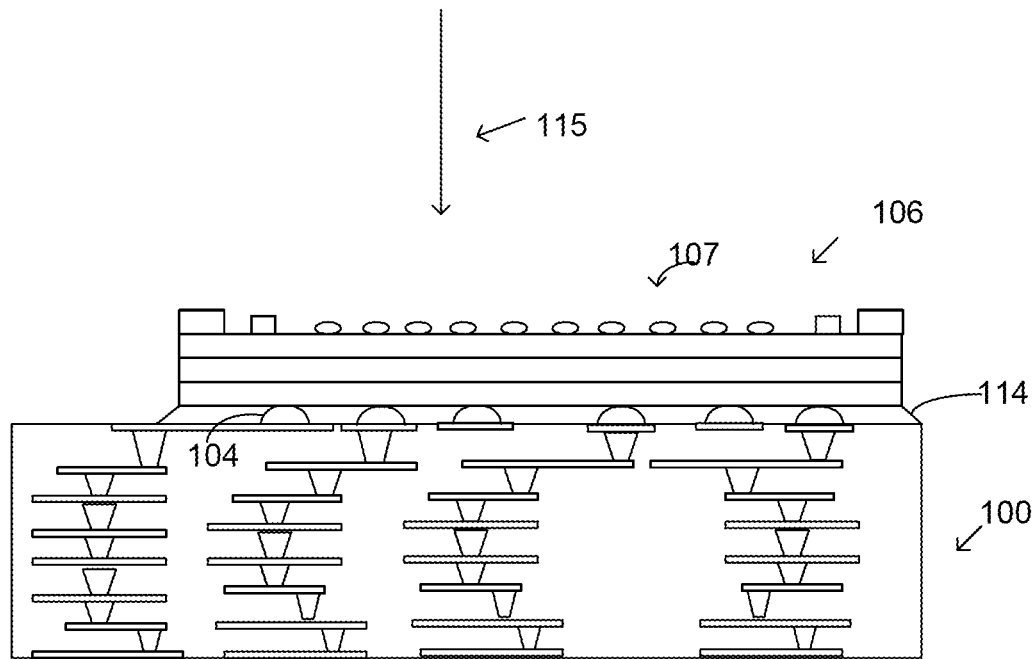

An underfill 114 may be applied to the interposer 100 MLI 104 region (FIG. 1d). The underfill 114 may be formed around the array of interconnect structures 104 disposed on the top surface 105 of the interposer 100. The underfill 114 may then undergo a cure process 115. In one embodiment, the cure process 115 may serve to provide additional stiffness to the patch on interposer structure 113 prior to a die attach process. In some cases, due to air core structures of an interposer and the thin core of a patch structure, prior art processes which utilize reflow of MLI structures for connecting a patch to an interposer may experience additional incoming and dynamic warpage for such a prior art patch on interposer structure. This increase in warpage may significantly impact the yield of such a prior art patch, first level interconnect (FLI) integration and also integration of such a patch to an interposer.

Figure 1E:
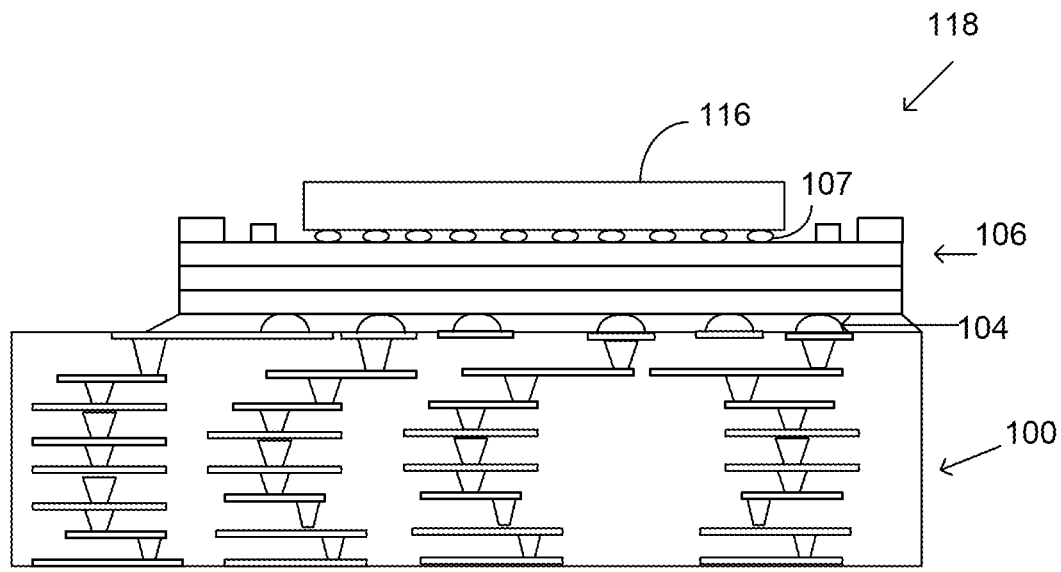

By enabling the MLI integration at low temperatures and exposing the patch on interposer to high temperatures only after underfill cure, the patch on interposer structures of the various embodiments of the invention herein tend to behave more like a stiffer/laminate core based motherboard. Thus, the patch on interposer structure 113 reduces dynamic warpage that may occur during a subsequent die attach process, and results in improved assembly flow by controlling warpage impact. In an embodiment, a die 116 may be attached to the point on interposer structure to form a patch on interposer package structure 116 (FIG. 1e).

In another embodiment, an interposer strip 200, which is depicted as comprising two interposers 201, 201', may comprise more than two interposers in some embodiments. In an embodiment, the number of interposers comprising the interposer strip 200 may or may not depend on the carrier design utilized for processing, for example. In one embodiment, the interposer strip 200 may comprise interposers 201, 201' that each may comprise a laminated interposer design with stacked laser fabricated vias (202, 202').

The stacked via structures 202, 202' may act as vertical interconnect structures within the interposers 201, 201'. The interposers 201, 201' may further comprise interconnect structures 204, 204' on top surfaces. 205, 205' of the interposers 201, 201. In an embodiment, the interconnect structures 204, 204' may comprise mid level interconnect (MLI) solder balls, such as but not limited to MLI ball grid array (BGA) solder balls. The interposer strip 200 may comprise a singulation point 203.

Figure 2A:
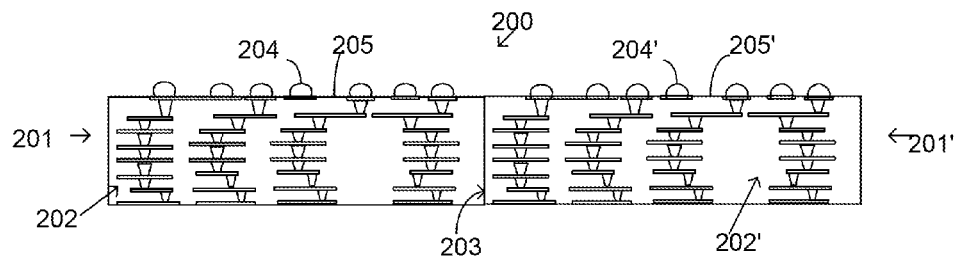
FIGS. 2a-2e represent methods of forming structures according to an embodiment of the present invention.
Figure 2B:
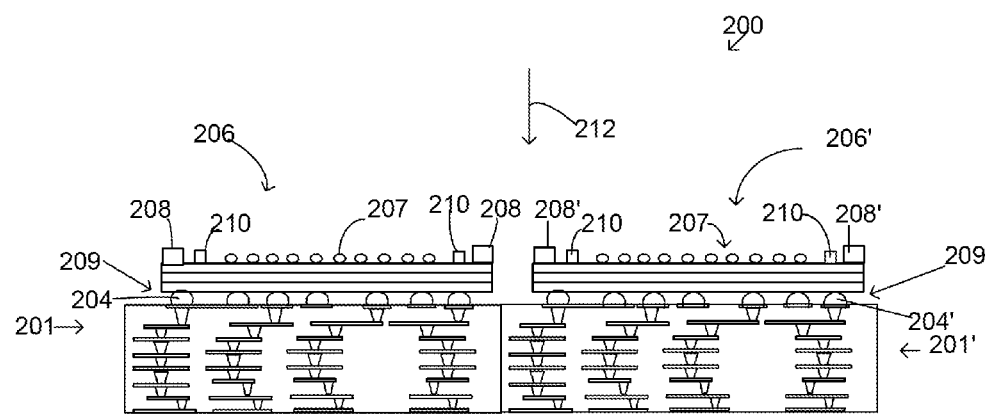

In an embodiment, at least one patch structure 206, 206' may be attached to the interposer strip 200 (FIG. 2b). In an embodiment, a patch structure 206, 206' may be attached to at least one of an individual interposer 200, 200' of the interposer strip 200. In an embodiment, the patch structures 206, 206' (similar to the patch structure 106 of FIG. 2b.) may comprise a thin core (about 400 microns in thickness, for example). In an embodiment, the patch structures 206, 206' may comprise at least one stiffener 208, 208' and at least one dsc 210, 210'. The patch structures 206, 206' may further comprise patch interconnect structures 207, 207', which may comprise solder balls in some embodiments.

In an embodiment, the patch structures 206, 206' may be attached to the interposer strip 200 through mid level interconnects (MLI) BGA connections 204, 204'. The attachment of the patches 206, 206' to the MLI 204, 204' of the interposer strip 200 may be performed by a thermal compressive bonding process (TCB) 212. In some embodiments, the TCB process 212 may comprise at least one of a miniball (reduced diameter solder ball) or a surface mount technology (SMT) attachment process, such as by utilizing a LGA-like pad with solder paste on the interposer. In an embodiment, a solder joint 209 (similar to the solder joint 109 of FIG. 1b) may attach/join the patch structures 206, 206' to the interposer strip 200.

Figure 2C:
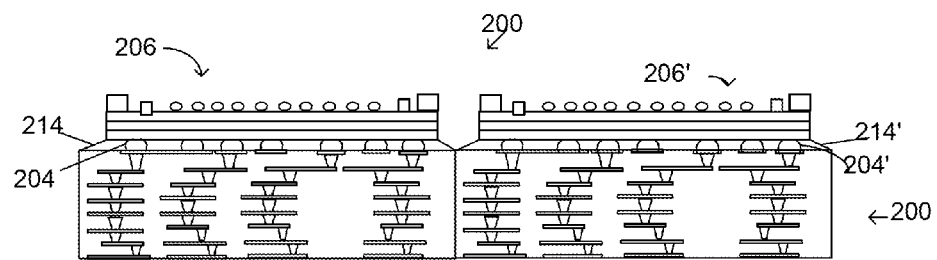
Figure 2D:
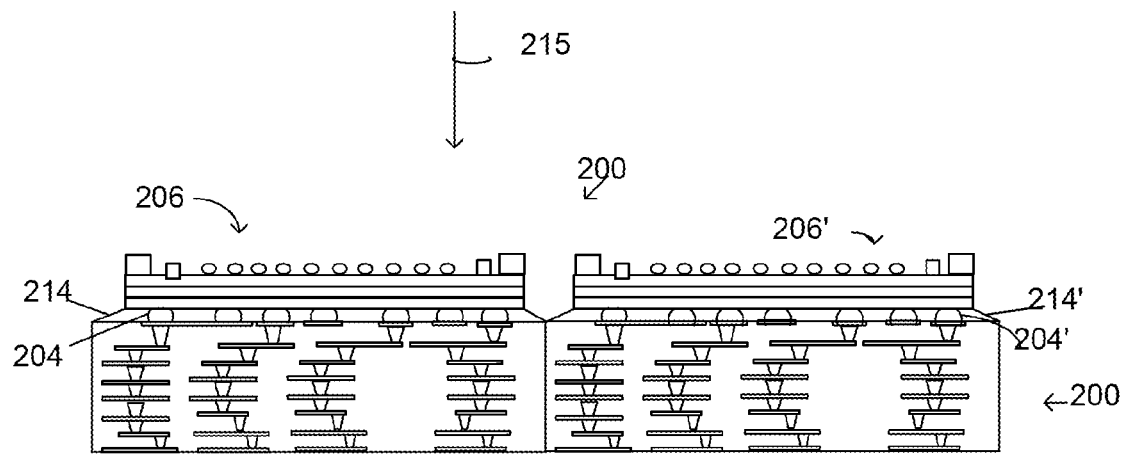
Figure 2E:
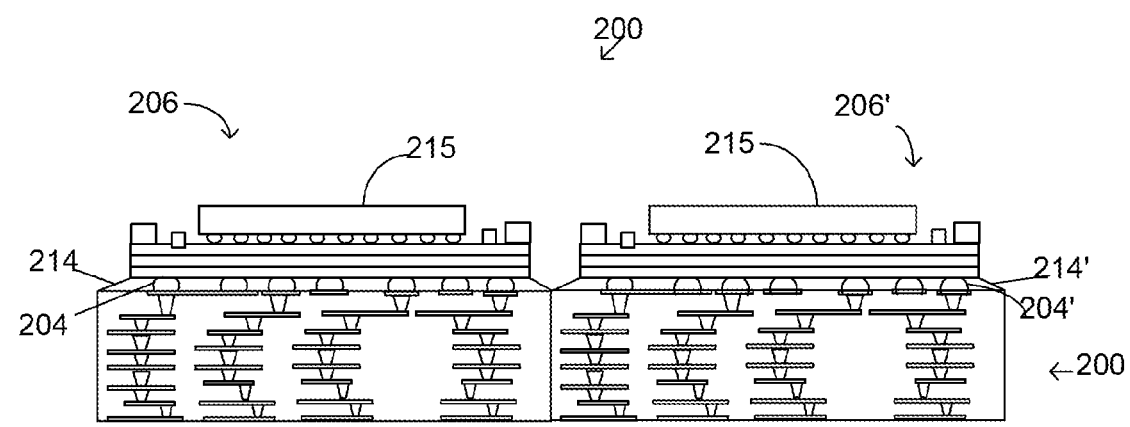

An underfill 214 may be applied to the interposer strip 200 MLI 204 region (FIG. 2c). In an embodiment, the underfill 214 may be formed around MLI regions 204, 204' of at least two adjacent interposers (for example, interposers 201, 201' of the interposer strip 200) prior to a singulation process of the interposer strip 200. The underfill 214 may then undergo a cure process 215 (FIG. 2d). In one embodiment, the cure process 215 may serve to provide additional stiffness to the package structure prior to a die attach process. The additional stiffening may significantly reduce warpage of the package structure. A die 216 may be attached to the package structure (FIG. 2e).

Figure 3:
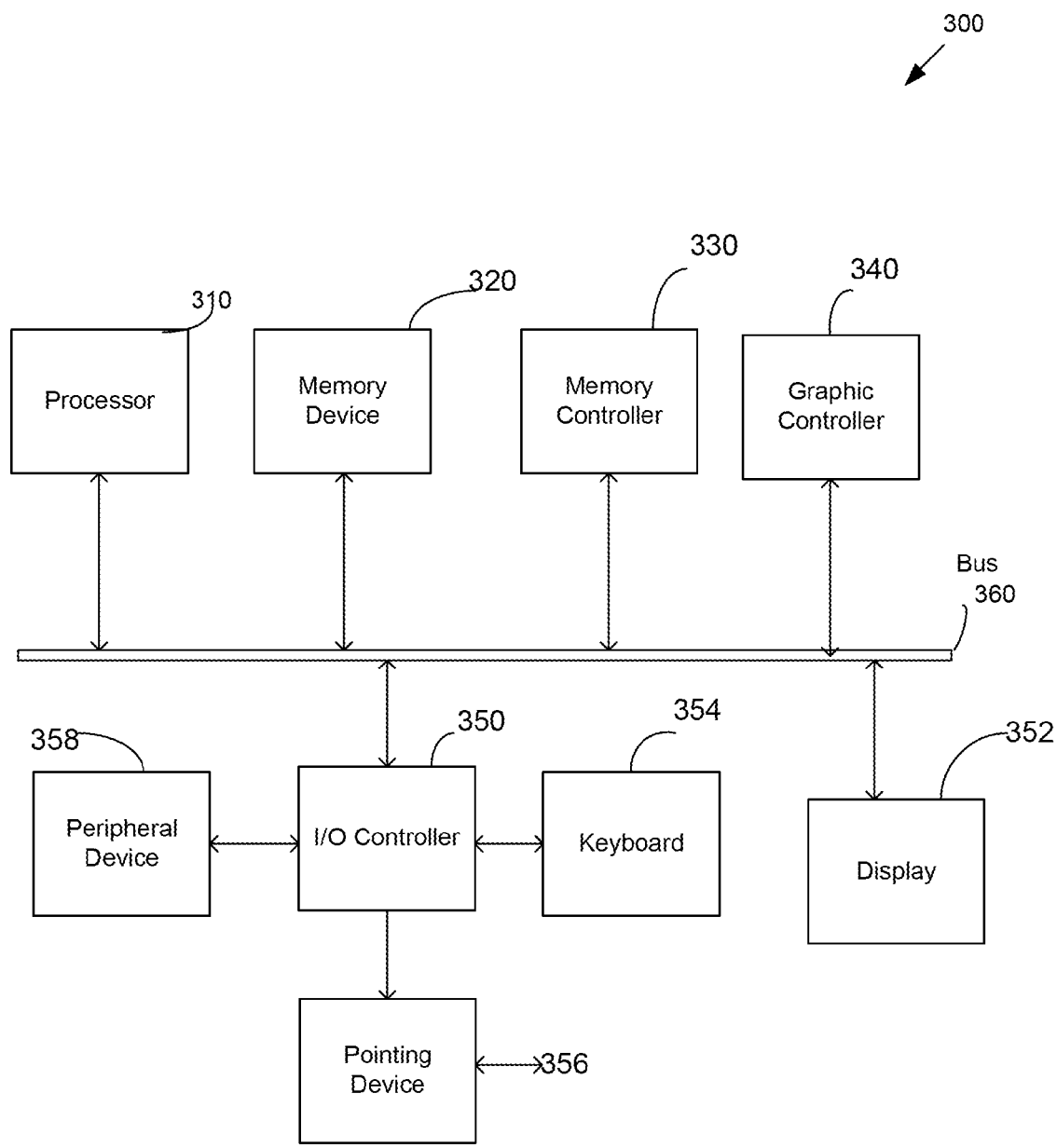
FIG. 3 represents a system according to an embodiment of the present invention.

FIG. 3 shows a computer system according to an embodiment of the invention. System 300 includes a processor 310, a memory device 320, a memory controller 330, a graphics controller 340, an input and output (I/O) controller 350, a display 352, a keyboard 354, a pointing device 356, and a peripheral device 358, all of which may be communicatively coupled to each other through a bus 360, in some embodiments. Processor 310 may be a general purpose processor or an application specific integrated circuit (ASIC). I/O controller 350 may include a communication module for wired or wireless communication. Memory device 320 may be a dynamic random access memory (DRAM) device, a static random access memory (SRAM) device, a flash memory device, or a combination of these memory devices. Thus, in some embodiments, memory device 320 in system 300 does not have to include a DRAM device.

One or more of the components shown in system 300 may be included in/and or may include one or more integrated circuit packages, such as the package structure 118 of FIG. 1e for example. For example, processor 310, or memory device 320, or at least a portion of I/O controller 350, or a combination of these components may be included in an integrated circuit package that includes at least one embodiment of a structure described in the various embodiments.

These elements perform their conventional functions well known in the art. In particular, memory device 320 may be used in some cases to provide long-term storage for the executable instructions for a method for forming packaged structures in accordance with embodiments of the present invention, and in other embodiments may be used to store on a shorter term basis the executable instructions of a method for forming package structures in accordance with embodiments of the present invention during execution by processor 310. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, memory device 320 may supply the processor 310 with the executable instructions for execution.

System 300 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Benefits of the embodiments included herein include the enablement of patch on interposer substrate packaging technology. Forming a joint between the interposer MLI structures and the patch structure by thermal compression bonding and then underfilling and curing the patch and interposer prior to completing die attach increases the stiffness of the structure, thus guarding against warpage. In some embodiments, there may be a significant CTE difference between the interposer and patch substrates, which may comprise organic substrates in some cases, and a die, which may comprise silicon. The warpage improvement may be achieved by attaching the patch to the interposer, which may have similar coefficients of temperature (CTE), before attaching the die, which may comprise silicon. Additionally, the various embodiments allow for restraining mechanisms to be integrated into the interposer strip carrier.

MLI integration at low temperatures is enabled by TCB processing and the patch on interposer structure is exposed to high temperatures only after underfill cure. Thus, the patch on interposer structures exhibits a stiffer/laminate core based-like substrate. In an embodiment, server packages may be assembled by TCB for MLI with reduced warpage by enabling a multi-connected interposer strip design wherein the patch structure may be SMT mounted prior to underfilling the patch on interposer structure. Assembling the patch on the interposer prior to die attach processing avoids significant CTE difference between the organic substrates and silicon die.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as package structures, are well known in the art. Therefore, the Figures provided herein illustrate only portions of an exemplary microelectronic structure that pertains to the practice of the present invention. Thus the present invention is not limited to the structures described herein.

What is claimed is:

1. A structure comprising:
    a patch structure disposed on an interconnect array of an interposer, wherein the interposer comprises stacked interconnect structures;
    at least one stiffener attached to the patch structure;
    a solder joint attaching the patch structure to the interposer;
    an underfill disposed around the interconnect array; and
    a die attached to the patch.

2. The structure of claim 1 wherein the interconnect array comprises a mid level interconnect ball grid array.

3. The structure of claim 1 wherein the stacked interconnect structures comprise stacked laser created vias.

4. The structure of claim 2 wherein the patch structure comprises less than about 400 microns in thickness.

5. The structure of claim 1 wherein the solder joint comprises a solder joint formed by thermal compression bonding.

6. The structure of claim 1 wherein the patch structure is capable of supporting routing and power delivery functions.

7. The structure of claim 6 wherein the patch structure comprises at least one stiffener disposed on a top surface of the patch structure.

8. The structure of claim 1 wherein the interposer comprises a least one of a motherboard and a small card.

9. A structure comprising:
    at least one patch structure disposed on an individual interposer of an interposer strip, wherein the interposer strip comprises at least two individual interposers;
    at least one stiffener attached to the patch structure;
    an underfill disposed around an array of interconnect structures disposed on a top surface of an individual interposer; and
    a die attached to the at least one patch structure.

10. The structure of claim 9 further comprising a system comprising:
    a bus is communicatively coupled to the structure; and
    a DRAM communicatively coupled to the bus.

11. The system of claim 9 wherein the underfill is disposed under adjacent individual interposers.

12. The system of claim 9 wherein the interposer strip comprises a multi connected interposer strip design.

13. The structure of claim 9 further comprising a solder joint attaching the at least one patch structure to the individual interposer.

14. The structure of claim 9 wherein the patch structure comprises a thin patch structure.

15. The structure of claim 9 further comprising wherein the structure comprises a portion of a server package.

* * * * *